United States Patent
Okandan et al.

(10) Patent No.: US 7,826,065 B1
(45) Date of Patent: Nov. 2, 2010

(54) TUNED OPTICAL CAVITY MAGNETOMETER

(75) Inventors: Murat Okandan, Edgewood, NM (US); Peter Schwindt, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 323 days.

(21) Appl. No.: 12/173,547

(22) Filed: Jul. 15, 2008

(51) Int. Cl.
*G01B 11/02* (2006.01)
*G01R 33/12* (2006.01)

(52) U.S. Cl. .................................... 356/521; 324/244.1
(58) Field of Classification Search ................. 356/521; 324/244.1
See application file for complete search history.

(56) References Cited

U.S. PATENT DOCUMENTS

| | | | |
|---|---|---|---|
| 5,053,708 A | 10/1991 | Aspect et al. | |
| 5,501,893 A | 3/1996 | Laermer et al. | |
| 5,978,401 A | 11/1999 | Morgan | |
| 5,982,174 A * | 11/1999 | Wagreich et al. | 324/244.1 |
| 6,414,473 B1 * | 7/2002 | Zhang et al. | 324/96 |
| 6,472,869 B1 | 10/2002 | Upschulte et al. | |
| 6,573,700 B2 * | 6/2003 | Zhang et al. | 324/96 |
| 7,038,450 B2 | 5/2006 | Romalis et al. | |
| 7,116,430 B2 | 10/2006 | Degertekin et al. | |
| 2009/0212769 A1 * | 8/2009 | Stoica et al. | 324/244.1 |

OTHER PUBLICATIONS

Marlan O. Scully et al, "High-Sensitivity Magnetometer Based on Index-Enhanced Media", Physical Review Letters, vol. 69, No. 9, Aug. 31, 1992, pp. 1360-1363.

M. Stahler et al, "Picotesla magnetometry with coherent dark states", Europhysics Letters, vol. 54, (3), 2001, pp. 323-328.

Neal A. Hall et al, "Capacitive Micromachined Ultrasonic Transducers with Diffration-Based Integrated Optical Displacement Detection", IEEE Transactions on Ultrasonics, ferroelectrics, and frequency control, vol. 50, No. 11, Dec. 2003, pp. 1570-1580.

Evan Thrush et al, "Integrated Semiconductor Vertical-Cavity Surface-Emitting Lasers and PIN Photodetectors for Biomedical Fluorescence Sensing", IEEE Journal of Quantum Electronics, vol. 40, No. 5, May 2004, pp. 491-498.

Peter D. D. Schwindt et al, "Chip-scale atomic magnetometer", Applied Physics Letters, vol. 85, No. 26 Dec. 27, 2004, pp. 6409-6411.

J. M. Higbie et al, "Rubust, high-speed, all-optical atomic magnetometer", Review of Scientific Instruments, vol. 77, 2006, 113106-1 thru -7.

I.K. Kominis et al, "A subfemtotesla multichannel atomic magnetometer", Letters to Nature, vol. 422, Apr. 10, 2003, pp. 596-599.

(Continued)

*Primary Examiner*—Michael A Lyons
(74) *Attorney, Agent, or Firm*—John P. Hohimer

(57) ABSTRACT

An atomic magnetometer is disclosed which utilizes an optical cavity formed from a grating and a mirror, with a vapor cell containing an alkali metal vapor located inside the optical cavity. Lasers are used to magnetically polarize the alkali metal vapor and to probe the vapor and generate a diffracted laser beam which can be used to sense a magnetic field. Electrostatic actuators can be used in the magnetometer for positioning of the mirror, or for modulation thereof. Another optical cavity can also be formed from the mirror and a second grating for sensing, adjusting, or stabilizing the position of the mirror.

24 Claims, 12 Drawing Sheets

OTHER PUBLICATIONS

D. Budker et al, "Nonlinear magneto-optical rotation with frequency-modulated light", Physical Review A, vol. 65, 055403-1 thru -4, May 2, 2002.

Peter D. D. Schwindt et al, "Chip-scale atomic magnetometer with improved sensitivity by use of the $M_x$ technique", Applied Physics Letters, vol. 90, 081102-1 thru -3, Feb. 21, 2007.

* cited by examiner

Section 1 - 1

Section 2 - 2

Section 3 - 3

TUNED OPTICAL CAVITY MAGNETOMETER

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to magnetometers, and in particular to atomic magnetometers which rely on polarizing an alkali metal vapor and probing the state of magnetization of the polarized alkali metal atoms to sense a magnetic field.

BACKGROUND OF THE INVENTION

High sensitivity detection of magnetic fields is critical to many applications including ordinance detection, geophysical mapping, navigation, and the detection of biomagnetic fields associated with heart and brain activity. Conventional superconducting magnetometers based on superconducting quantum interference devices (SQUIDs) provide a high sensitivity for magnetic field detection but are bulky and require expensive cryogenic cooling. Atomic magnetometers, which are based on optical measurements of an unpaired electron spin in an alkali metal vapor are being developed. These atomic magnetometers do not require cryogenic cooling; and they are capable of measuring the absolute magnetic field at high sensitivity (down to less than one femto Tesla).

The present invention provides an advance in the art of atomic magnetometers by providing an atomic magnetometer which can be formed, at least in part, by micromachining.

The atomic magnetometer of the present invention also provides a new method and apparatus for detecting magnetic fields by utilizing an optical cavity formed by a transmission grating and a mirror which are spaced about a vapor cell containing an alkali metal vapor. The effect of a magnetic field on the alkali metal vapor is to change an effective index of refraction within the optical cavity of the present invention. When a probe laser beam is coupled through the transmission grating into the optical cavity, a diffracted laser beam is generated as the probe laser beam is coupled out of the optical cavity through the transmission grating; and this can produce a zeroth-order component and a first-order component in the diffracted laser beam. By measuring these components of the diffracted laser beam with separate photodetectors in the apparatus of the present invention, electrical signals can be generated from the photodetectors which can be used to determine the intensity of the magnetic field.

These and other advantages of the present invention will become evident to those skilled in the art.

SUMMARY OF THE INVENTION

The present invention relates to an apparatus for sensing a magnetic field (i.e. a magnetometer) which comprises an optical cavity formed by a grating and a mirror which are spaced about a vapor cell which contains an alkali metal vapor. The vapor cell can also contain a buffer gas which can include a noble gas and which can also include nitrogen. A pump laser beam is directed into the vapor cell to magnetically polarize the alkali metal vapor which can be heated to a temperature which is effective to provide a density of the alkali metal vapor which is greater than $10^{11}$ atoms-$cm^{-3}$ and which can range up to about $10^{15}$ $cm^{-3}$.

A probe laser beam is directed into the optical cavity and through the vapor cell to generate a diffracted laser beam from the optical cavity which has a zeroth-order component and a first-order component. Each component of the diffracted laser beam has an intensity which depends upon the magnetic field through an interaction of the magnetic field with the magnetically-polarized alkali metal vapor. A photodetector is provided in the apparatus to detect each component of the diffracted laser beam and to generate therefrom an electrical output signal wherefrom an intensity of the magnetic field can be determined.

The mirror can comprise a moveable mirror which can be suspended by a plurality of springs and which can also be made moveable by one or more actuators which are electrostatically coupled to the moveable mirror. This is useful to align the mirror with the grating, to adjust a length of the optical cavity, and also to modulate the cavity length for synchronous detection of the diffracted laser beam.

The pump laser beam can be circularly polarized. A magnetic shield and one or more sets of magnetic-field-cancelling coils can be provided about the optical cavity to substantially cancel a background magnetic field in certain embodiments of the present invention. A magnetic flux transformer can also be used with the apparatus to couple a transient magnetic field inside the magnetic shield to sense the transient magnetic field using the apparatus.

The present invention also relates to an apparatus for sensing a magnetic field which comprises a vapor cell that contains an alkali metal vapor (e.g. comprising sodium, potassium, rubidium or cesium). A buffer gas can also be present in the vapor cell. The buffer gas generally comprises a noble gas and can also include nitrogen. An optical cavity is formed about the vapor cell, with the optical cavity comprising a transmission grating (e.g. a first-order transmission grating) and a mirror. A pump laser beam is directed into the vapor cell to magnetically polarize the alkali metal vapor; and a probe laser beam is directed into the optical cavity and through the vapor cell containing the alkali metal vapor to generate a diffraction pattern which depends upon the magnetic field. The diffraction pattern is transmitted out of the optical cavity and can be detected using a plurality of photodetectors which generate electrical output signals that can be used to determine the magnetic field. The probe laser beam can be generated, for example, by a vertical-cavity surface-emitting laser (VCSEL).

The mirror can comprise a moveable mirror. Such a moveable mirror can be suspended by a plurality of springs. One or more electrostatic actuators can be coupled to the mirror for movement thereof.

Another optical cavity can be provided in the apparatus, with this other optical cavity being formed from the moveable mirror and another transmission grating. A position-sensing laser beam can be directed into this other optical cavity and used to determine the position of the moveable mirror.

The present invention further relates to an apparatus for sensing a magnetic field which comprises a vapor cell containing an alkali metal vapor; an optical cavity formed about the vapor cell, with the optical cavity comprising a transmission grating and a mirror; a pump laser beam directed into the vapor cell to magnetically polarize the alkali metal vapor; a probe laser beam directed into the optical cavity, with the probe laser beam passing through the vapor cell and being reflected by the mirror and diffracted by the transmission grating to form at least one diffracted laser beam having an intensity which depends on an interaction of the magnetic field with the magnetically-polarized alkali metal vapor; and a photodetector to detect each diffracted laser beam and to generate therefrom an electrical output signal to provide an indication of the magnetic field. The diffracted laser beam can include a zeroth-order diffracted laser beam and/or a first-order diffracted laser beam.

The pump laser beam can be circularly polarized. The probe laser beam can be directed into the optical cavity along an optical axis thereof; and the pump laser beam can be directed into the vapor cell at an angle which is substantially perpendicular to the optical axis of the optical cavity. Each laser beam can be generated by a vertical-cavity surface-emitting laser (VCSEL).

The mirror can be made moveable using one or more electrostatic actuators. Another optical cavity can also be formed by the mirror and another transmission grating, with a position-sensing laser beam being directed into this other optical cavity to determine a position of the mirror.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
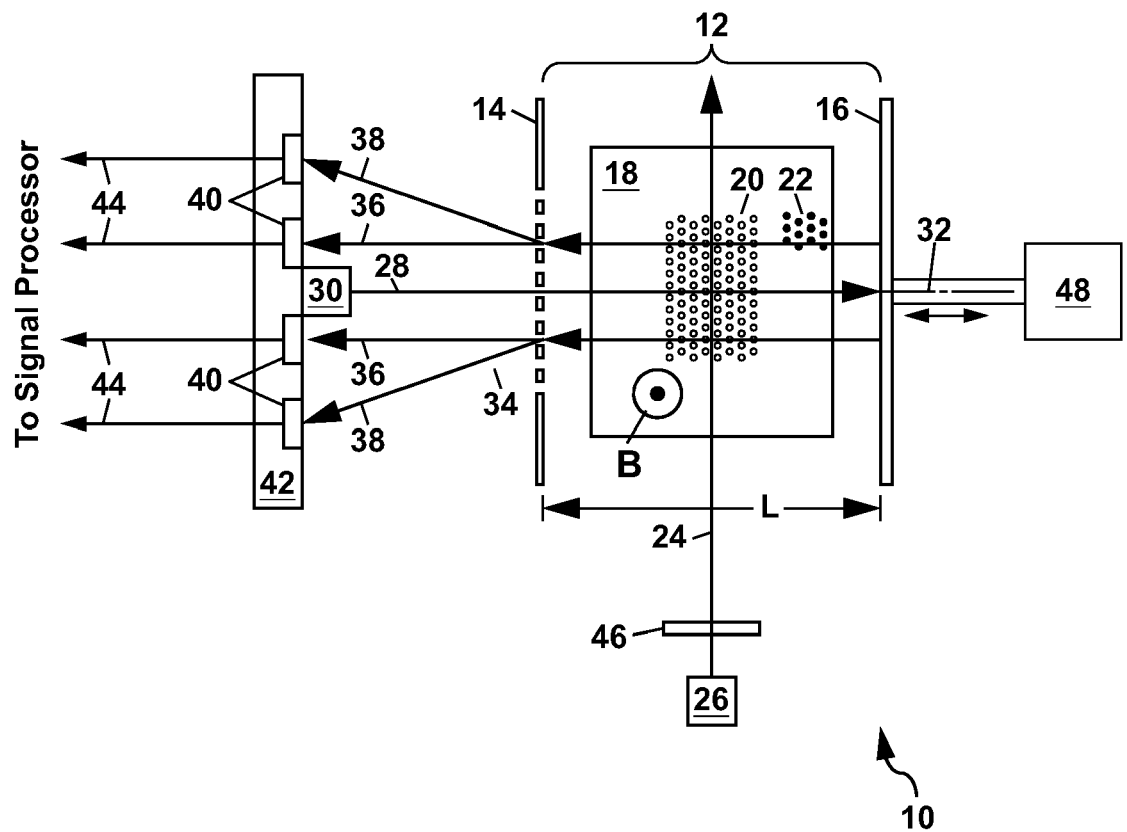
FIG. 1 shows a schematic plan view of a first example of an apparatus for sensing a magnetic field according to the present invention.

FIG. 1 shows a schematic diagram of a first example of an apparatus 10 for sensing a magnetic field according to the present invention. This apparatus 10, which is also referred to herein as a tunable optical cavity magnetometer 10 or simply as a magnetometer 10, comprises an optical cavity 12 which is formed by a grating 14 and a mirror 16, with a vapor cell 18 being located inside the optical cavity 12. The vapor cell 18 contains an alkali metal vapor 20 and can also contain a buffer gas 22 (e.g. comprising a noble gas such as neon). Another gas such as nitrogen can also be added to the buffer gas. A pump laser beam 24, which can be generated by a pump laser 26, is directed into the vapor cell 18 to magnetically polarize the alkali metal vapor 20 (i.e. to magnetically polarize individual alkali metal atoms of the vapor 20). A probe laser beam 28, which can be generated by a probe laser 30, is directed into the optical cavity 12 along an optical axis 32 thereof. The probe laser beam 28 is reflected off of the mirror 16 and is diffracted by the grating 14 so that a portion of the probe laser beam 28 is returned out of the cavity 12 in the form a diffracted laser beam 34.

Figure 3A:
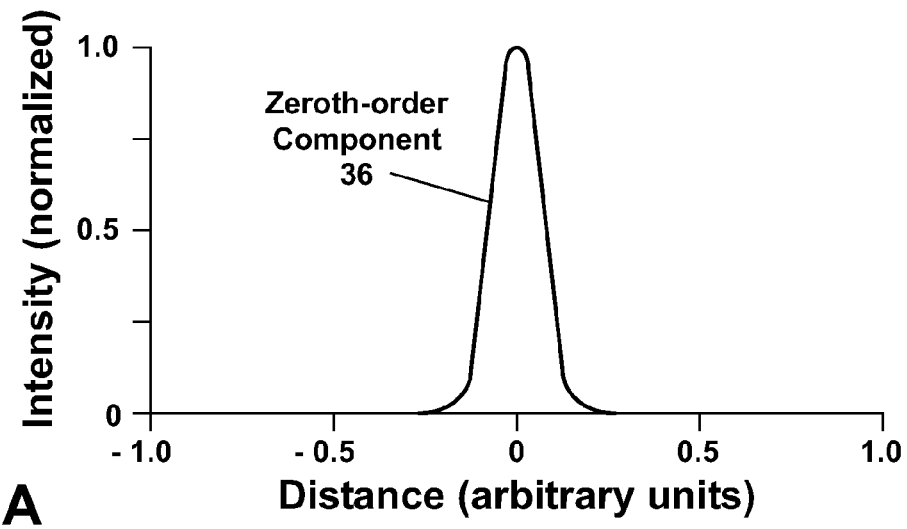
FIG. 3A shows an intensity distribution in a diffraction pattern at the plane of the photodetectors for the apparatus of FIG. 1 which is produced by the zeroth-order component of the diffracted laser beam when the effective optical length $L_{eff}$ of the optical cavity is equal to one-half wavelength ($\lambda/2$) of the probe laser beam, or a multiple thereof.
Figure 3B:
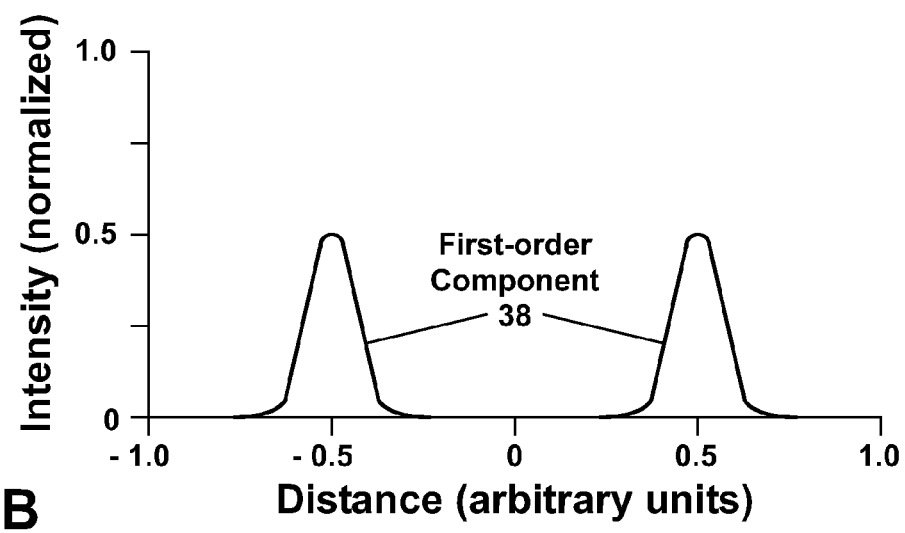
FIG. 3B shows the intensity distribution in the diffraction pattern at the plane of the photodetectors in the apparatus of FIG. 1 which is produced by the first-order component of the diffracted laser beam when the effective optical length $L_{eff}$ of the optical cavity is equal to one-quarter wavelength ($\lambda/4$) of the probe laser beam, or an odd multiple thereof.

The diffracted laser beam 34 can comprise one or more components which can include a zeroth-order component 36 which can be directed substantially parallel to the optical axis 32, and a first-order component 38 which is generally directed off axis with two intensity peaks each being at substantially the same an angle with respect to the optical axis 32 (see FIG. 3B). Each component 36 and 38 of the diffracted laser beam 34 has an intensity of light which depends upon a change in an effective optical length $L_{\textit{eff}}$ of the optical cavity 12 produced by a magnetic field B or a change $\Delta B$ therein which is being sensed by the apparatus 10. In FIG. 1, the magnetic field B is in a z-direction which is substantially normal to a plane defined by the laser beams 24 and 28 (i.e. substantially perpendicular to the plane of FIG. 1) and is indicated by a circle with a dot therein. The effective optical length $L_{\textit{eff}}$ of the optical cavity 12 is given by:

$$L_{\textit{eff}} = \int_0^L n(l)\,dl$$

where L is a physical length between the grating 14 and the mirror 16 and n(l) is the index of refraction n at any point l along the length L of the optical cavity 12.

Each component 36 and 38 of the diffracted laser beam 34 can be detected with a separate photodetector 40 to generate an electrical output signal 44. The electrical output signals 44 can be used to determine the intensities of the components 36 and 38; and this information can be related to a change in the effective optical length $L_{\textit{eff}}$ of the optical cavity 12 which is produced by the interaction of the alkali metal vapor 20 with the magnetic field B to determine the field B or any change $\Delta B$ therein. The photodetectors 40 can be formed on a common substrate 42 which can also be used to support the probe laser 30 which can be a vertical-cavity surface-emitting laser (VCSEL). The optical power in the probe laser beam 28 can be on the order of 1 milliWatt (mW) or more, with the exact optical power required depending upon the size of the vapor cell 18.

In the magnetometer 10 of FIG. 1, the pump laser beam 24 can be circularly polarized, and can be provided by another VCSEL. The optical power in the pump laser beam 24 can be up to a few mW. A quarter-wave plate 46 can be provided in a path of the pump laser beam 24 as shown in FIG. 1 when the pump laser beam 24 is emitted from the laser 26 as a linearly-polarized beam. The quarter-wave plate 46 converts the linearly-polarized pump laser beam 24 to being circularly polarized at an output side of the quarter-wave plate 46.

Circular polarization for the pump laser beam 24 is useful for optically pumping individual atoms of the alkali metal vapor 20 which are in the path of the pump laser beam when the wavelength of the pump laser beam 24 is tuned to an atomic transition of the alkali metal vapor 20. The atomic transition of the alkali metal vapor 20 can be a $D_1$ line, or a $D_2$ line. In cesium, the $D_1$ line ($6S_{1/2}$–$6P_{1/2}$ atomic transition) occurs at a wavelength of 895 nanometers (nm); and the $D_2$ line ($6S_{1/2}$–$6P_{3/2}$ transition) occurs at 852 nm. The $D_1$ and $D_2$ lines of other alkali metal atoms (e.g. Na, K and Rb) can be used when an alkali metal vapor 20 other than cesium is used in the apparatus 10 of the present invention.

Figure 2A:
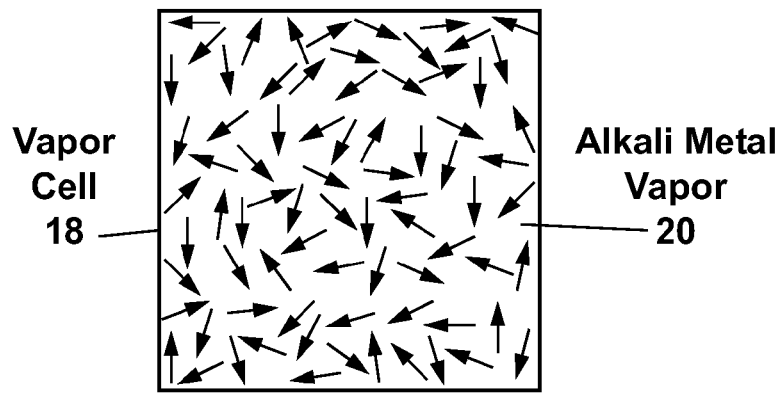
FIG. 2A schematically illustrates an initial random alignment of the spins of the alkali metal atoms in the vapor cell of the apparatus of FIG. 1, with an axis of the spins being indicated by the arrows.

In the absence of the pump laser beam 24, the nuclear and electron spins of the individual atoms of the alkali metal vapor 20 will be randomly polarized as indicated by the arrows in FIG. 2A which depict a spin axis for individual alkali metal atoms. The terms "spins" and "spin axis" are used interchangeably herein.

Figure 2B:
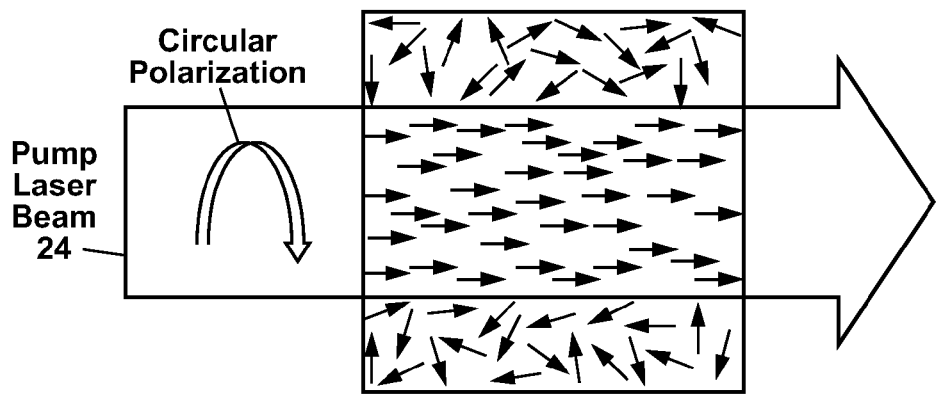
FIG. 2B schematically illustrates the magnetic polarization of the spins of the alkali metal atoms in the vapor cell of the apparatus of FIG. 1 which is produced by optical pumping of certain of the alkali metal atoms using a circularly-polarized pump laser beam.

The optical pumping of the alkali metal vapor 20 orients the spins of the individual alkali metal atoms so that they are in a magnetically-polarized state with the spin of each alkali metal atom being aligned along the direction of the pump laser beam 24 as shown by the horizontal arrows in FIG. 2B. The alkali metal atoms located outside of the pump laser beam 24 remain randomly polarized as shown in FIG. 2B.

The noble gas (e.g. neon) which is provided in the buffer gas 22 in the vapor cell 18 is useful to slow down a rate at which the atoms of the alkali metal vapor 20 collide with the inner walls of the vapor cell 18 which can again randomize the spins of the alkali metal atoms. The noble gas can be, for example, at a pressure of about 60 kiloPascals (kPa). The buffer gas 22 can also contain nitrogen which is useful to quench an upper state transition resulting from the pump laser beam 24 and thereby relax the metal vapor atoms 20 into the magnetically-polarized state at a more rapid rate. The nitrogen can be, for example, at a pressure of about 4 kPa.

Figure 2C:
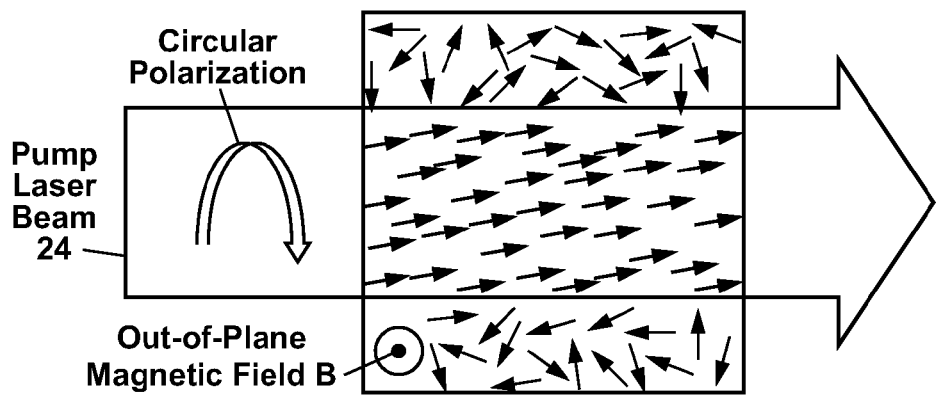
FIG. 2C schematically illustrates the rotation of the spins of the alkali metal atoms in FIG. 2B in the presence of an out-of-plane magnetic field B.

A magnetic field B which passes through the vapor cell 12 as shown in FIG. 2C interacts with the magnetically-polarized alkali metal vapor 20 to generate in a torque on the spins of the alkali metal atoms which have been magnetically polarized by the pump laser beam 24. This torque due to the magnetic interaction with the alkali metal atoms causes the spins of the alkali metal atoms to be rotated at an angle with respect to the pump laser beam 24 as shown in FIG. 2C and to magnetically precess about the optical axis 32 at the well-known Larmor frequency. The exact angle and Larmor frequency of the spins of the alkali metal atoms relative to the magnetic field B will depend upon the intensity of and direction of the magnetic field B.

The magnetic interaction between the magnetic field B and the atoms in the alkali metal vapor 20 will produce a refractive index change $\Delta n$ in the index of refraction n of the alkali metal vapor 20. This change in the refractive index $\Delta n$ can also be viewed as a phase shift $\phi$ in the probe laser beam 28 as the beam 28 travels back and forth through the optical cavity 12. The phase shift $\phi$ of the probe laser beam 28 in propagating back and forth through the optical cavity 12 and through the alkali metal vapor 20 therein is given by:

$$\phi = \frac{2L_{\textit{eff}}\omega}{c} = \frac{2L\omega}{c} + 4\pi L c N r_e f_{D1} D(\omega)\left(\frac{1 - P_x}{2}\right)$$

where $\omega$ is the frequency of the light in the probe laser beam 28, c is the speed of light, L is the physical length of the vapor cell 18, N is a density of the alkali metal atoms which can range from about $10^{11}$ cm$^{-3}$ to $10^{15}$ cm$^{-3}$ depending upon a temperature of the vapor cell 18 which will generally be heated, $r_e$ is the classical electron radius, and $f_{D1}$ is the oscillator strength of the $D_1$ line of the alkali metal atoms. In the above equation for the phase shift $\phi$, $D(\omega)$ is the real part of the electric susceptibility of the alkali metal vapor 20 and is given by:

$$D(\omega) = \frac{\omega - \omega_0}{(\omega - \omega_0)^2 + (\Gamma/2)^2}$$

where $\omega_0$ is the frequency of the atomic transition (i.e. the $D_1$ line) and $\Gamma$ is the linewidth of the atomic transition. In the above equation, $P_x$ is the atomic polarization in steady state along the direction of the probe laser beam 28 and is given by:

$$P_x = \frac{R_p}{\frac{R_{Tot}^2}{\gamma B_z} + \gamma B_z}$$

where $R_p$ is the optical pumping rate for the pump laser beam 24, $R_{Tot}$ is the total atomic depolarization rate including, for example, the effect of collisions with the inner walls of the vapor cell 18, y is the gyro-magnetic ratio of the alkali metal atoms, and $B_z$ is the z component of the magnetic field B which is perpendicular to a plane defined by the pump laser beam 24 and the probe laser beam 28. In the example of FIG. 1, the z component of the magnetic field B is perpendicular to the plane of FIG. 1.

The above equation for the phase shift φ assumes that the entire length L of the optical cavity 12 is filled with the alkali metal vapor 20 and is optically pumped by the pump laser beam 24. When the alkali metal vapor 20 is contained within only a portion of the length of the optical cavity 12, or when the pump laser beam 24 optically pumps only a portion of the alkali metal vapor 20, suitable modifications can be made to the above equation for the phase shift φ to take these factors into account.

The phase shift φ of the probe laser beam 28 in the optical cavity 12, which is related to the effective optical length $L_{eff}$ of the optical cavity 12 according to the above equation, can be determined from a measurement of the components 36 and 38 of the diffracted laser beam 34. The phase shift φ can then be used with the above equations to determine the magnetic field $B_z$. This measurement can be performed with the probe laser beam 28 being offset in frequency from the atomic transition frequency $\omega_0$ by generally a few GigaHertz or more.

Each component 36 and 38 of the diffracted laser beam 34 depends upon a phase relationship of two interfering portions of the probe laser beam 28, including a first portion of the probe laser beam 28 which is reflected directly off the grating 14 and a second portion of the probe laser beam 28 which is transmitted through the grating 14 into the optical cavity 12, reflected by the mirror 16 and then redirected back through the grating 14. This second portion of the probe laser beam 28 undergoes the above phase shift φ due to the magnetic field $B_z$. In the absence of any magnetic field B, and with the length L of the optical cavity 12 adjusted appropriately, the optical phase of the two portions of the probe laser beam 28 will in phase (i.e. a phase shift of a multiple of 360° which is equivalent to a 0° phase shift). In this case, the two portions of the probe laser beam 28 will add together constructively; and this will generate the zeroth-order component 36 in the diffracted laser beam 34 as shown in FIG. 3A. When viewed in a plane of the photodetectors 40, the diffracted laser beam 34 will appear as a diffraction pattern having a single peak. This will occur when effective optical length $L_{eff}$ of the optical cavity 12 is equal to one-half wavelength (λ/2) or an integral multiple thereof of the wavelength of the probe laser beam 28.

On the other hand, when the optical phase of these two portions of the probe laser beam 28 are exactly out of phase (i.e. out of phase by 180° or a multiple thereof) due to a change in the length L or the magnetic field $B_z$ or both, the two portions of the probe laser beam 28 which contribute to the diffracted laser beam 34 will add together destructively. This will generate the first-order component 38 of the diffracted laser beam 34 as shown in FIG. 3B which has a diffraction pattern consisting of two off-axis peaks at the plane of the photodetectors 40. This will occur when the effective optical length $L_{eff}$ of the optical cavity 12 is equal to one-quarter wavelength (λ/4) or an odd multiple thereof of the wavelength of the probe laser beam 28.

Figure 3C:
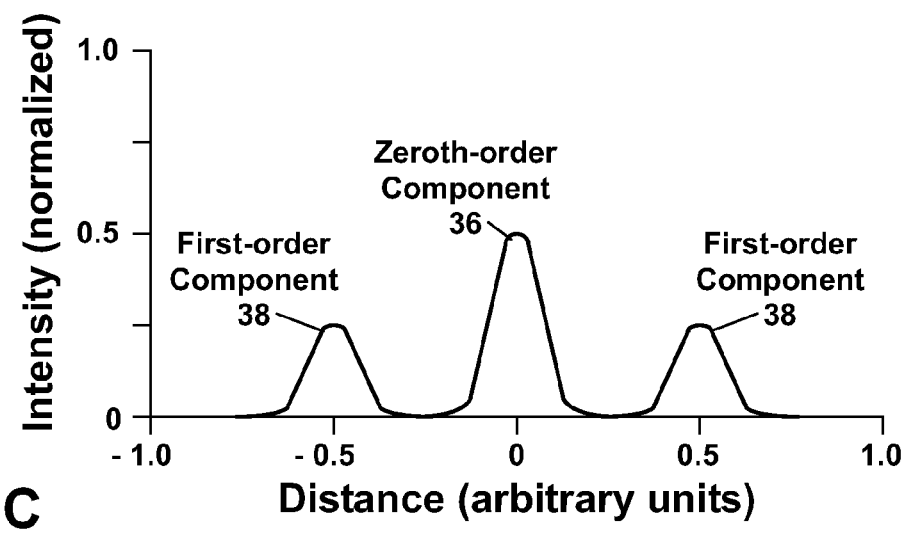
FIG. 3C shows the intensity distribution in the diffraction pattern at the plane of the photodetectors in the apparatus of FIG. 1 which is produced by a combination of the zeroth-order component and the first-order component of the diffracted laser beam when the effective optical length $L_{eff}$ of the optical cavity is equal to one-eighth wavelength ($\lambda/8$) of the probe laser beam, or an odd multiple thereof.

In general, the diffraction pattern at the plane of the photodetectors 40 formed by the diffracted laser beam 34 will contain peaks due to both the zeroth-order component 36 and the first-order component 38. The intensities of the peaks for each component 36 and 38 will depend upon the phase shift φ and on the effective optical length $L_{eff}$ of the optical cavity 12 due to the interaction of the magnetic field B with the magnetically polarized alkali metal vapor 20. This is schematically illustrated in FIG. 3C which shows the diffraction pattern produced in the apparatus 10 when the effective optical length $L_{eff}$ of the optical cavity 12 is equal to one-eighth wavelength (λ/8), or an odd multiple thereof.

The diffraction pattern produced by the components 36 and 38 of the diffracted laser beam 34 can be detected with the photodetectors 40 which are arranged spatially as shown in FIG. 1. In FIG. 1, two photodetectors 40 are shown immediately adjacent to each side of the probe laser 30. These photodetectors 40 can be used to detect the zeroth-order component 36 which can have a size larger than that of the probe laser 30.

Figure 6A:
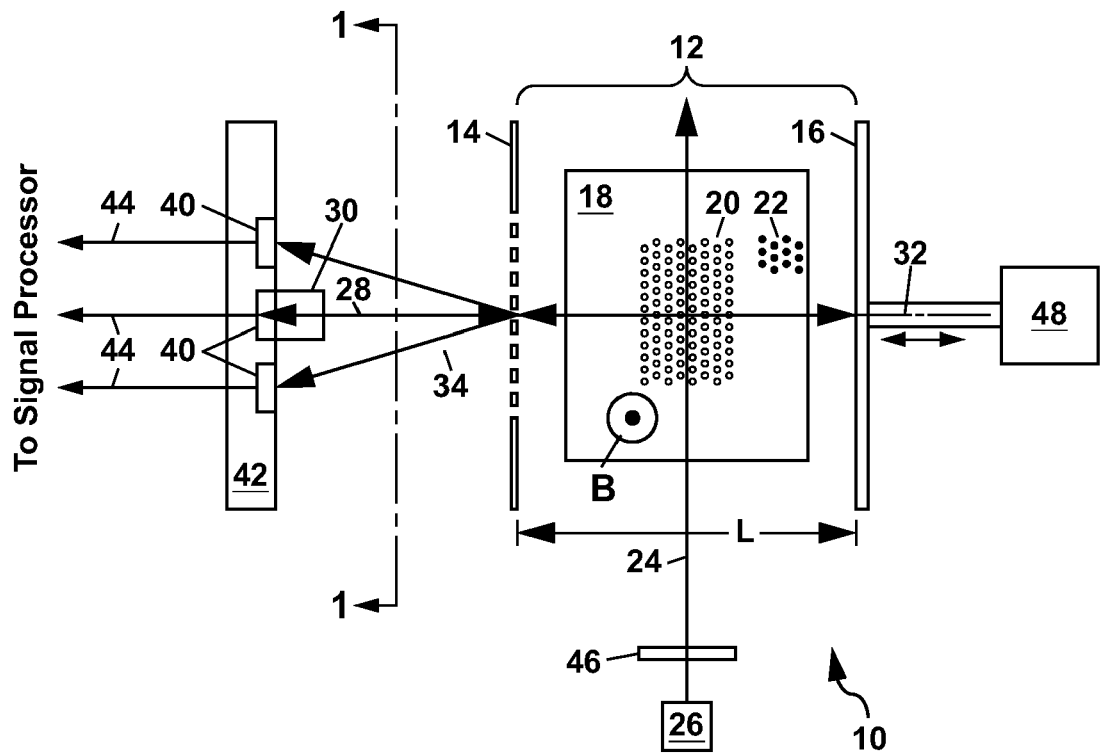
FIG. 6A shows a schematic plan view of a fourth example of the apparatus for sensing a magnetic field according to the present invention in which a probe laser and a position-sensing laser are located on a common substrate.
Figure 6B:
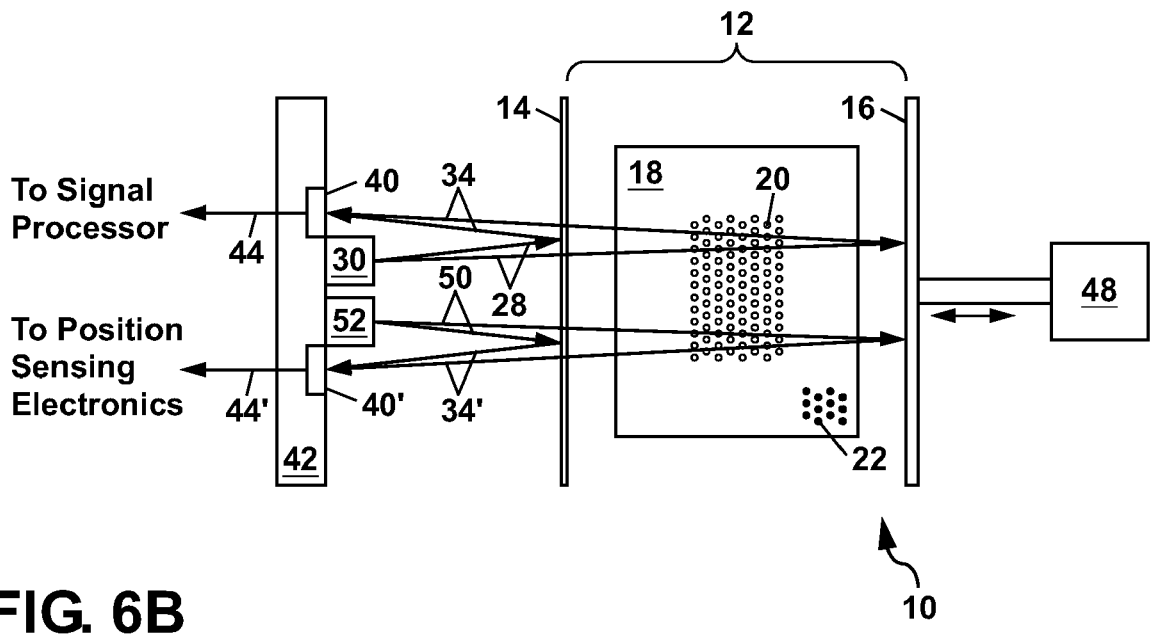
FIG. 6B shows a schematic side view of the apparatus of FIG. 6A to show how the lasers and photodetectors can be arranged vertically on the common substrate with the probe laser beam and the position-sensing laser beam being spatially separated.
Figure 6C:
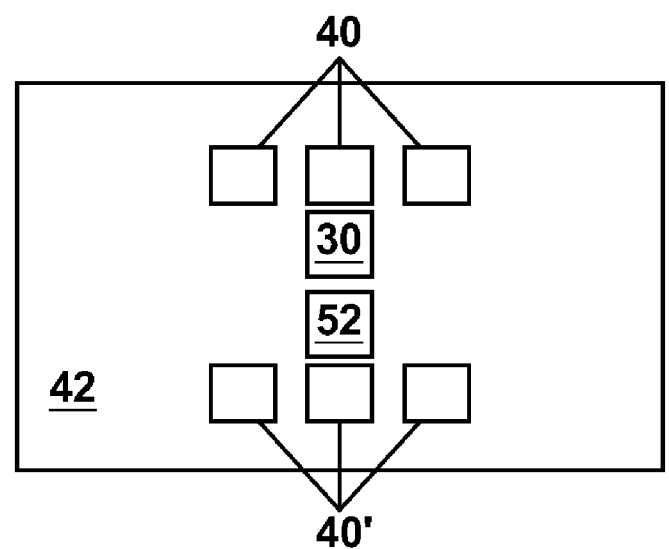
FIG. 6C shows a schematic view of the common substrate along the section line 1-1 in FIG. 6A to show the arrangement of the lasers and photodetectors thereon.

In other embodiments of the present invention, a single photodetector 40 can be used to detect this zeroth-order component 36 (see FIGS. 6A-6C). This single photodetector 40 can, in some instances be an annular photodetector formed about the probe laser 30. In FIG. 1, additional photodetectors 40 are provided to detect the first-order component 38.

Each photodetector 40 can comprise a semiconductor p-n or p-i-n junction which is formed either from silicon or from a III-V compound semiconductor (e.g. GaAs). As an example, the photodetectors 40 can comprise silicon p-i-n junctions formed in a silicon substrate 42, with a commercially-available VCSEL probe laser 30 being attached to the silicon substrate 42. As another example, the photodetectors 40 can be epitaxially grown on a GaAs substrate 42 together with a GaAs/AlGaAs VCSEL probe laser 30. A GaAs/AlGaAs VCSEL pump laser 26 can also be optionally grown on the same GaAs substrate 42 with the pump laser beam 24 being directed into the vapor cell 18 using a 45° mirror or a prism.

The integration of VCSEL lasers and p-i-n photodetectors on a common substrate is well-known in the art. See, for example, E. Thrush et al., "Integrated Semiconductor Vertical-Cavity Surface-Emitting Lasers and PIN Photodetectors for Biomedical Fluorescence Sensing," *IEEE Journal of Quantum Electronics*, vol. 40, pp. 491-498 (May 2004) and U.S. Pat. No. 5,978,401 which are incorporated herein by reference.

The electrical output signals 44 generated by the photodetectors 40 from the zeroth-order component 36 and the first-order component 38 of the diffracted laser beam 34, can be subtracted from each other. This can be done, for example, using a differential amplifier and is advantageous to reduce any noise due to the probe laser beam 28.

Phase sensitive detection of the electrical output signals 40 can also be used in the apparatus 10 of the present invention to process the signals 40 from the photodetectors 40 and thereby further reduce noise and improve a detection sensitivity for small changes in the magnetic field B. This can be done, for example, by periodically changing (i.e. modulating) the physical length L of the optical cavity 12 at a predetermined frequency (e.g. 5-10 kHz) using a moveable mirror 16. Such a moveable mirror 16 is also useful to adjust the length L of the cavity 12 to a predetermined value (e.g. an odd multiple of λ/8) for optimum sensitivity of the apparatus 10.

Movement of the mirror 16 can be performed using an actuator 48 which is coupled to the mirror 16. In some preferred embodiments of the present invention, the actuator 48 can be an electrostatic actuator 48 as will be described in detail hereinafter (see FIG. 7).

In the example of FIG. 1, the grating 14 can comprise a transmission grating which can be formed, for example, by depositing metal (e.g. aluminum, silver or gold) on a transparent substrate (e.g. comprising quartz, fused silica, or glass) and then patterning the metal by liftoff or etching to form a plurality of parallel grating lines which can be, for example, 1 µm wide and spaced apart by 2-5 µm (i.e. with a 20-50% duty cycle). The mirror 16 can include a metal coating of gold, aluminum or silver.

Figure 4:
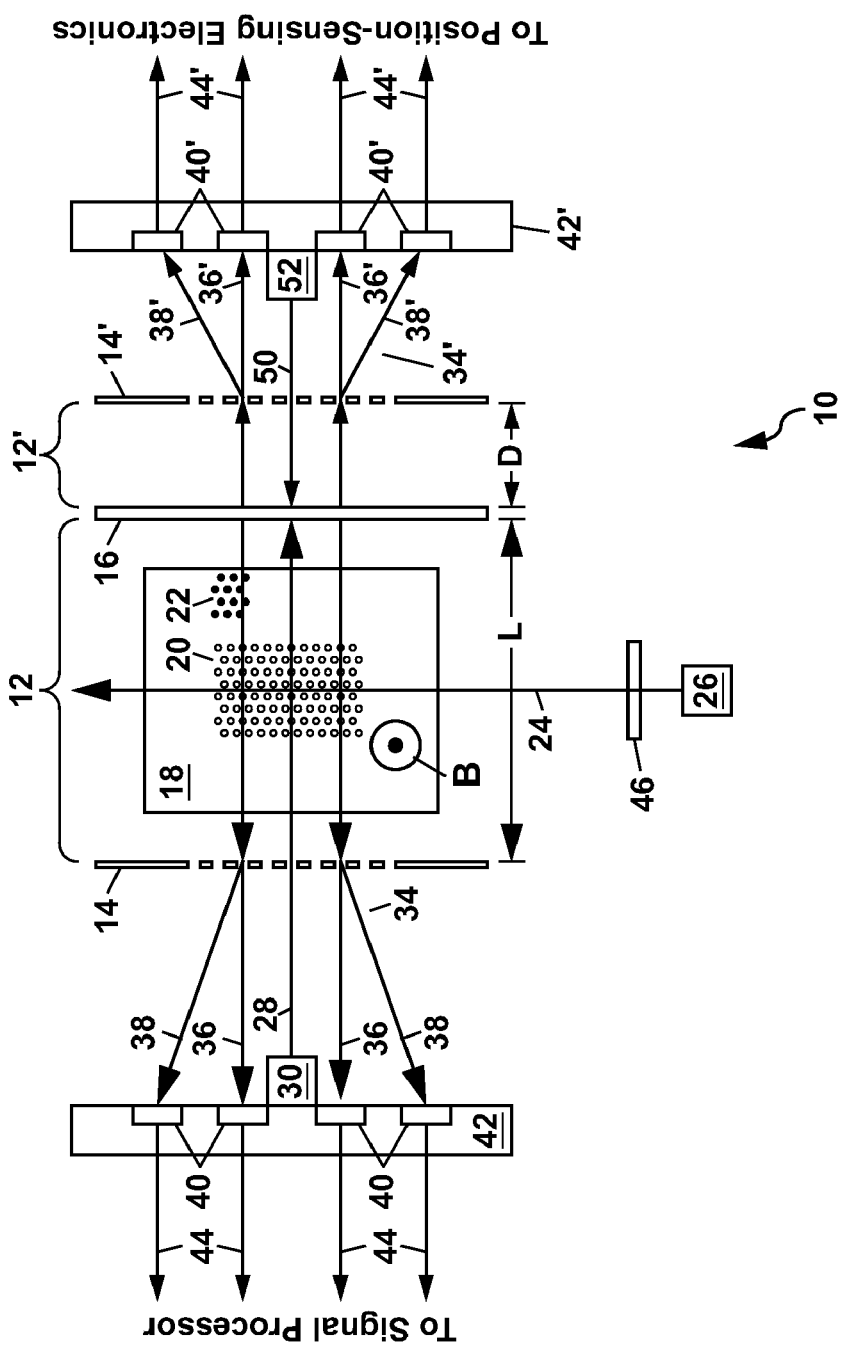
FIG. 4 shows a schematic plan view of a second example of the apparatus for sensing a magnetic field according to the present invention.

FIG. 4 shows a second example of the magnetometer 10 of the present invention. In this example, a second optical cavity 12' is formed by the mirror 16 and a second grating 14'. The optical cavity 12' can be used to sense the position of the mirror 16 when the mirror 16 is movable, and also can be used to stabilize the position of the mirror 16 using a feedback loop to one or more actuators 48 which control the position of the mirror 16 in order to provide a predetermined length L for the optical cavity 12. Stabilization of the mirror 16 can be performed during calibration of the apparatus 10 so that very small changes in the magnetic field B can be detected which are on the order of one picoTesla or less.

To determine the position of the mirror 16 using the optical cavity 12', a position-sensing laser beam 50 from a position-sensing laser 52 can be directed into the optical cavity 12'. A portion of the position-sensing laser beam 50 is reflected off of the grating 14'; and another portion of the beam 50 is transmitted through the grating 14' to be reflected off the mirror 16 and redirected back through the grating 14' with a phase shift $\phi'=2D\omega_p/c$ where $\omega_p$ is the frequency of the light in the position-sensing laser beam 50, D is the spacing between the mirror 16 and the grating 14' and c is the speed of light. The two portions of the position-sensing laser beam 50 will then recombine at the grating 14' to form a diffracted laser beam 34' having a zeroth-order component 36' or a first-order component 38' or both depending upon the relative optical phases of these two portions of the position-sensing laser beam 50. This will form a diffraction pattern at the plane of a plurality of photodetectors 40' in a manner similar to that previously described with reference to FIGS. 3A-3C.

The two components 36' and 38' of the diffracted laser beam 34' can be detected with the photodetectors 40' to generate electrical output signals 44' which can be combined in position-sensing electronics which can include a differential amplifier to combine the signals 44 and thereby cancel out any noise due to the position-sensing laser 52. The position-sensing electronics can include a lock-in amplifier when the positions of the mirror 16 and/or the grating 14' are modulated with electrostatic actuators 48 (see FIGS. 8A-8C), and can also include a feedback loop to control the electrostatic actuators 48.

The information generated from the optical cavity 12' and the position-sensing laser beam 50 can be used to determine the position of the mirror 16 relative to the grating 14, thereby providing a means for calibrating the position of the mirror 16. This can be done, for example, by comparing the electrical output signals 44 and 44' for different positions of the mirror 16 with the mirror 16 being moved by one or more actuators 48. The mirror 16 need only be moved over a small distance on the order of a few tens of nanometers since the phase shift of the light in each optical cavity 12 and 12' is periodic for multiples of one-half wavelength of the light in each cavity 12 and 12'.

Calibration of the position of the mirror 16 can be performed, for example, in the absence of any magnetic field B being sensed. This can be done, for example, by locating the apparatus 10 within a magnetic shield 54 as shown in a third example of the magnetometer 10 of the present invention in FIG. 5. In this example, one or more sets of magnetic-field-cancelling coils 56 can be provided about the apparatus 10 and electrically activated to cancel out any residual magnetic field. Alternately, calibration of the position of the mirror 16 can be performed in the presence of a known background magnetic field B (e.g. the earth's magnetic field).

Phase sensitive detection with a lock-in amplifier can be used to process the electrical output signals 44' in a manner similar to that described previously for the electrical output signals 44 from the optical cavity 12. Phase sensitive detection requires modulation of the signals being detected in order to separate the signals at a particular reference frequency from other unwanted signals and noise. For the optical cavity 12 modulation at the reference frequency can be performed by modulating an electrical current to the pump laser 26 or to the probe laser 28 although this may not be preferable since this can change the frequency of the light emitted by these lasers. The magnetometer 10 of the present invention provides an alternative to modulation of the lasers 26 and 28 by allowing the position of the mirror 16 to be modulated instead. In embodiments of the present invention which utilize phase sensitive detection for both the probe laser beam 28 and the position-sensing beam 50, this can also be done by modulating the position of the mirror 16 or alternately by modulating the position of the mirror 16 at a first reference frequency and modulating the position of the grating 14' at a second reference frequency. Each reference frequency can be, for example, from a few kiloHertz to a few tens of kiloHertz. This modulation of the position of the mirror 16 and/or the grating 14' can be performed using one or more electrostatic actuators 48.

Figure 5:
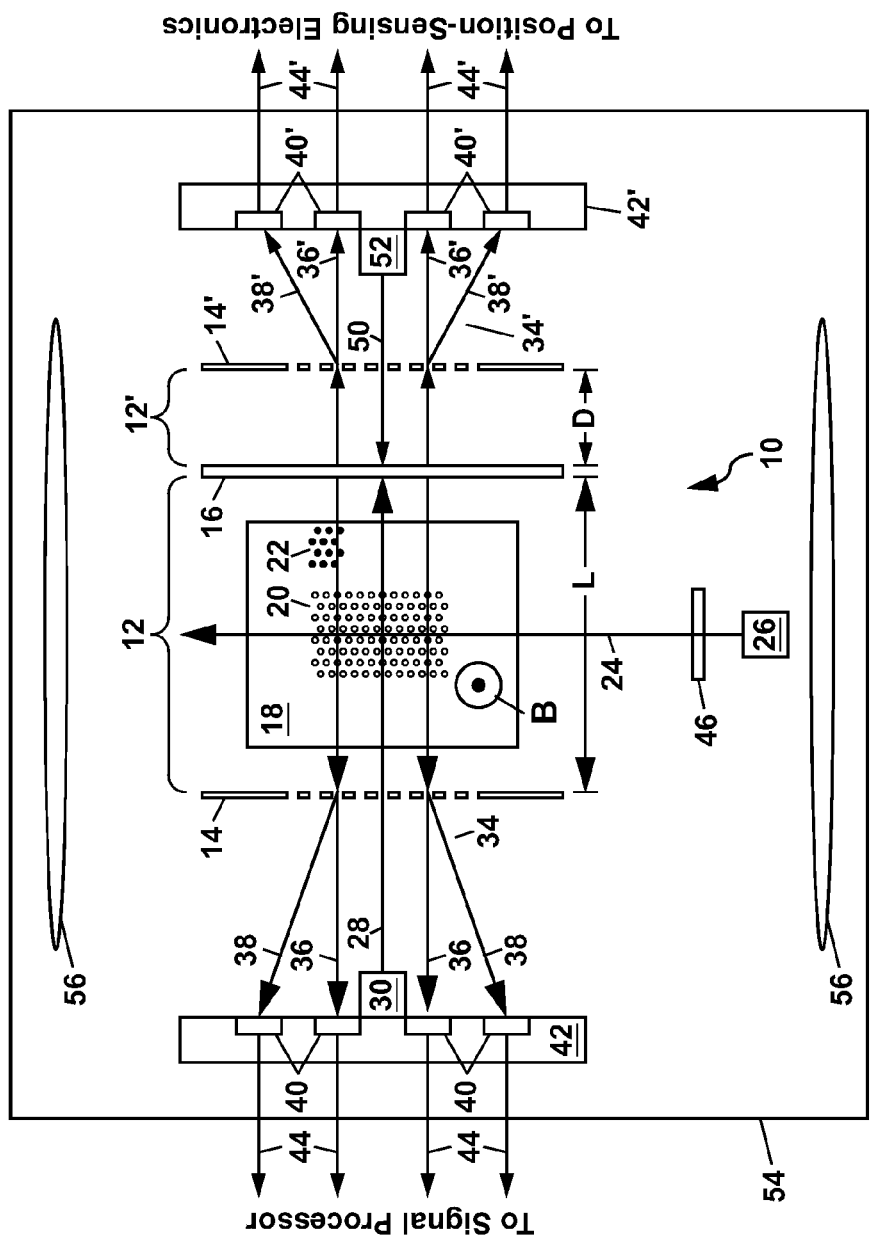
FIG. 5 shows a schematic plan view of a third example of the apparatus for sensing a magnetic field according to the present invention which utilizes a magnetic shield and a plurality of magnetic-field-cancelling coils.

In the examples of FIGS. 4 and 5, the frequency $\omega_p$ of the position-sensing laser beam 50 can be arbitrarily selected and can be well-removed (e.g. several nanometers or more) from the frequency w of the probe laser beam 28 and from the atomic transition frequency $\omega_0$. This is useful to prevent any inadvertent interaction between the position-sensing laser beam 50 and the alkali metal vapor 20, or to prevent the position-sensing laser beam 50 from contributing to the electrical output signals 44 in the event of any leakage of this beam 50 through the mirror 16 and into the optical cavity 12. The mirror 16 can also be formed as a double-sided mirror 16 with a reflective coating (e.g. comprising gold) on each side thereof to prevent leakage of the position-sensing laser beam 50 into the optical cavity 12.

In other embodiments of the present invention, the position-sensing laser 52 and the photodiodes 40' can be located on a common substrate 42 with the probe laser 30 and the detectors 40. This is useful perform a direct measurement of the position of the mirror 16 without any need for the additional optical cavity 12'. This arrangement is shown for a fourth example of the magnetometer 10 of the present invention in FIGS. 6A-6C.

FIG. 6A shows a schematic plan view of this fourth example of the magnetometer 10; and FIG. 6B shows a schematic side view of the device 10. For this device 10, a first set of three photodetectors 40 are used to sense the diffracted laser beam 34 to determine the magnetic field B, with one of the photodetectors 40 sensing the zeroth-order component 36 and with the other two photodetectors 40 sensing the first-order component 38. The first set of photodetectors 40 can be located along a line that is above the probe laser 30 as shown in FIGS. 6B and 6C. A second set of three photodetectors 40' can be similarly used to sense the diffracted laser beam 34' to determine the position of the mirror 16, with this set of photodetectors 40' being located along a line that is beneath the position-sensing laser 52 as shown in FIGS. 6B and 6C.

In this fourth example of the present invention, the probe laser beam 28 is angled slightly upward so that the diffracted laser beam 34 is incident on the photodetectors 40; and the position-sensing laser beam 52 is angled slightly downward so that the diffracted laser beam 34' is incident on the photodetectors 40'. This spatially separates the two diffracted laser beams 34 and 34' to minimize any cross-talk therebetween.

The magnetometer 10 of the present invention can be formed as a compact device in a size as small as one cubic centimeter. This can be done using conventional semiconductor processing and micromachining methods as known to the art. This is illustrated for a fifth example of the magnetometer 10 in FIG. 7. In this fifth example of the present invention, the magnetometer 10 can be formed by attaching the substrate 42 containing the probe laser 30 and a plurality of photodetectors 40 to one side of an annular spacer 58 with the grating 14 being attached to or formed on an opposite side of the spacer 58. The annular spacer 58 can be a substrate (e.g. comprising glass, quartz, fused silica, or silicon) upon which the grating 14 is formed by depositing and patterning a metal layer (e.g. comprising gold).

Another annular spacer 58' can be stacked above the spacer 58 and used to define the physical length L (e.g. 2 mm) of the optical cavity 12. This spacer 58', which supports the mirror 16 and a second grating 14' can be formed as a part of a mirror/grating assembly 70 as will be described in detail hereinafter with reference to FIGS. 8A-8C. The spacer 58' can have an opening 60 through one or both sides thereof to admit the pump laser beam 24. Alternately, when the spacer 58' is transparent, the pump laser beam 24 can be transmitted through the sides of the substrate 58' and into the vapor cell 18 located therein. The spacer 58' also has a vertical opening 62 therethrough between the grating 14 and the mirror 16 (see FIGS. 8A and 8C), with the vertical opening 62 being sized to hold the vapor cell 18 which can be a rectangular prism with the alkali metal vapor 20 and the buffer gas 22 provided therein. The vapor cell 18 can be formed, for example, from quartz, fused silica or glass.

To control the number density n of the alkali metal vapor 20 in the vapor cell 18, electrical resistance heaters 64 can be provided on the sides of the spacer 58'. Temperature sensors (e.g. thermistors) can also be provided in the apparatus 10 to measure the temperature of the vapor cell 18 and to provide feedback to a temperature controller which can be used to stabilize the temperature of the vapor cell 18. The exact temperature of the vapor cell 18 will depend upon the particular alkali metal (e.g. Na, K, Rb, or Cs) used in the apparatus 10 and on the atomic number density required for the alkali metal vapor 20. As an example, when cesium is used as the alkali metal vapor 20, the temperature of the vapor cell 18 can be about 120° C. In general, the temperature of the vapor cell 18 can be up to a few hundred degrees Celsius.

Figure 7:
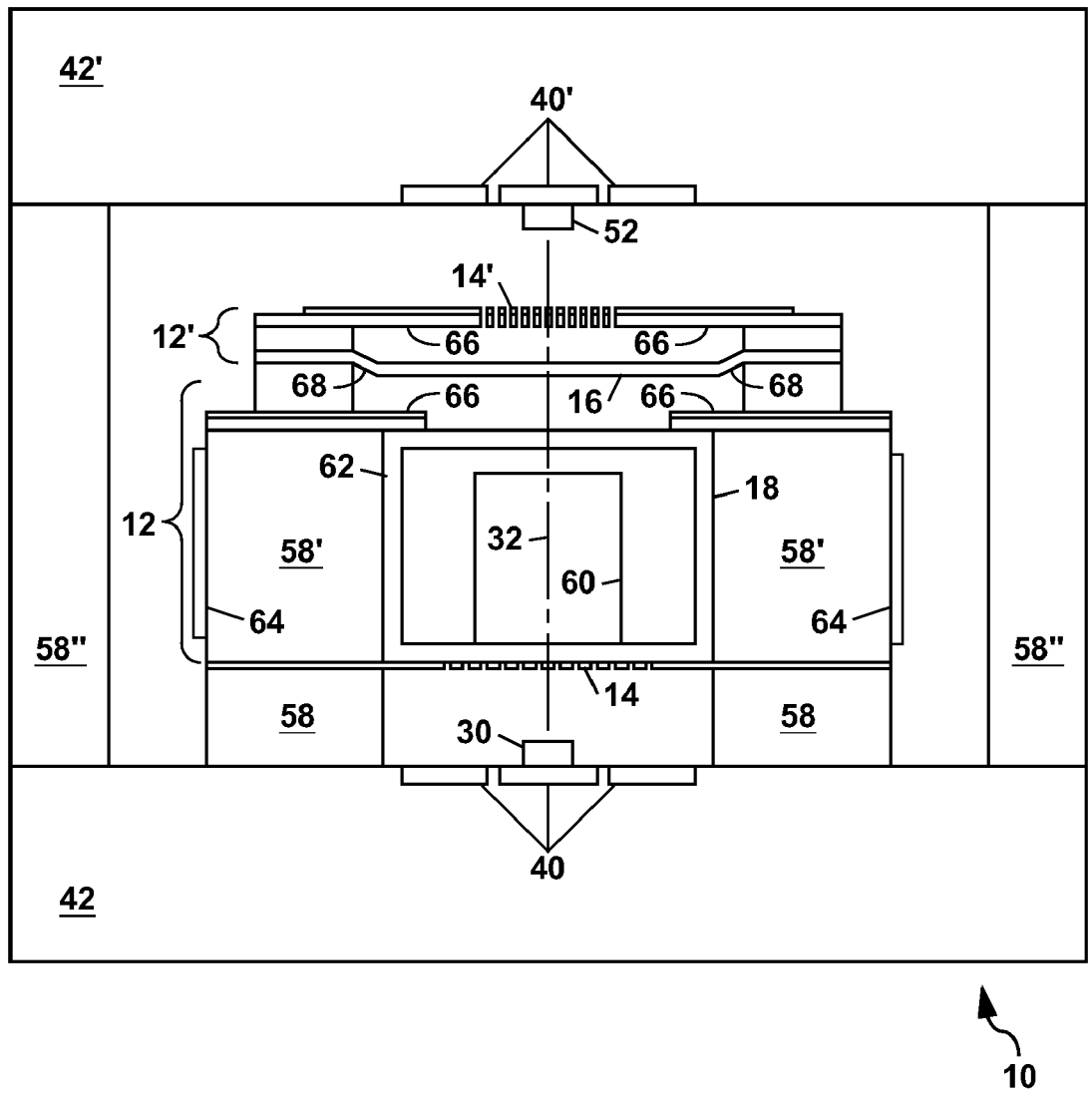
FIG. 7 shows a schematic cross-section view of a fifth example of the apparatus for sensing a magnetic field according to the present invention.

In the example of FIG. 7, the mirror 16 and the grating 14' can be supported upon the spacer 58' with electrodes 66 being provided above and below the mirror 16. Each electrode 66 in combination with the mirror 16 forms an electrostatic actuator 48 which can be used to move the mirror 16 either upward or downward as needed to adjust the length L of the optical cavity 12, or to modulate the position of the mirror 16 for phase sensitive detection of the diffracted laser beam 34. Layers of electrically-insulating materials (e.g. silicon nitride, silicon dioxide, or a silicate glass such as TEOS) can be used to electrically insulate the electrodes 66.

The length of the second optical cavity 12' can be, for example, about 2 µm; with a spacing between the electrodes 66 and the mirror 16 being, for example, 2-6 µm. To move the mirror downward towards the grating 14 to decrease the length L of the optical cavity 12, a voltage can be applied between the mirror 16 and the electrodes 66 located beneath the mirror 16. Similarly, to move the mirror 16 upwards to increase the optical cavity length L, a voltage can be applied between the mirror 16 and the electrodes 66 located thereabove. To facilitate this electrostatic movement of the mirror 16, the mirror 16 is suspended on a plurality of springs 68 (see FIGS. 8A-8C).

In the example of FIG. 7, the position-sensing laser 52 and photodetectors 40' can be supported on another substrate 42' which can be attached to the substrate 42 using yet another spacer 58" which can be annular in shape. One or more openings can be provided through the spacer 58" to admit the pump laser beam 24, or the spacer 58" can be transparent. In certain embodiments of the present invention, the pump laser 26 can also be located on one of the substrates 42 or 42', with a turning mirror (e.g. a 45° mirror) or a prism being provided in the apparatus 10 to direct the pump laser beam 24 through the vapor cell 12. Electrical vias (not shown) can be formed through each substrate 42 and 42' to allow external electrical connections to be made to the lasers 26, 30 and 52 and photodetectors 40 and 40'. Additional contact pads and vias can also be provided on the substrate 42 for making electrical connections to the heaters 64 and electrodes 66.

Conventional surface micromachining can be used to form the mirror 16 and grating 14' in the device of FIG. 7, and in the other examples of the present invention presented herein. Surface micromachining is based on repeated steps of depositing and patterning materials including polycrystalline silicon (also termed polysilicon), silicon nitride, silicon dioxide, and silicate glasses (e.g. TEOS).

Figure 8A:
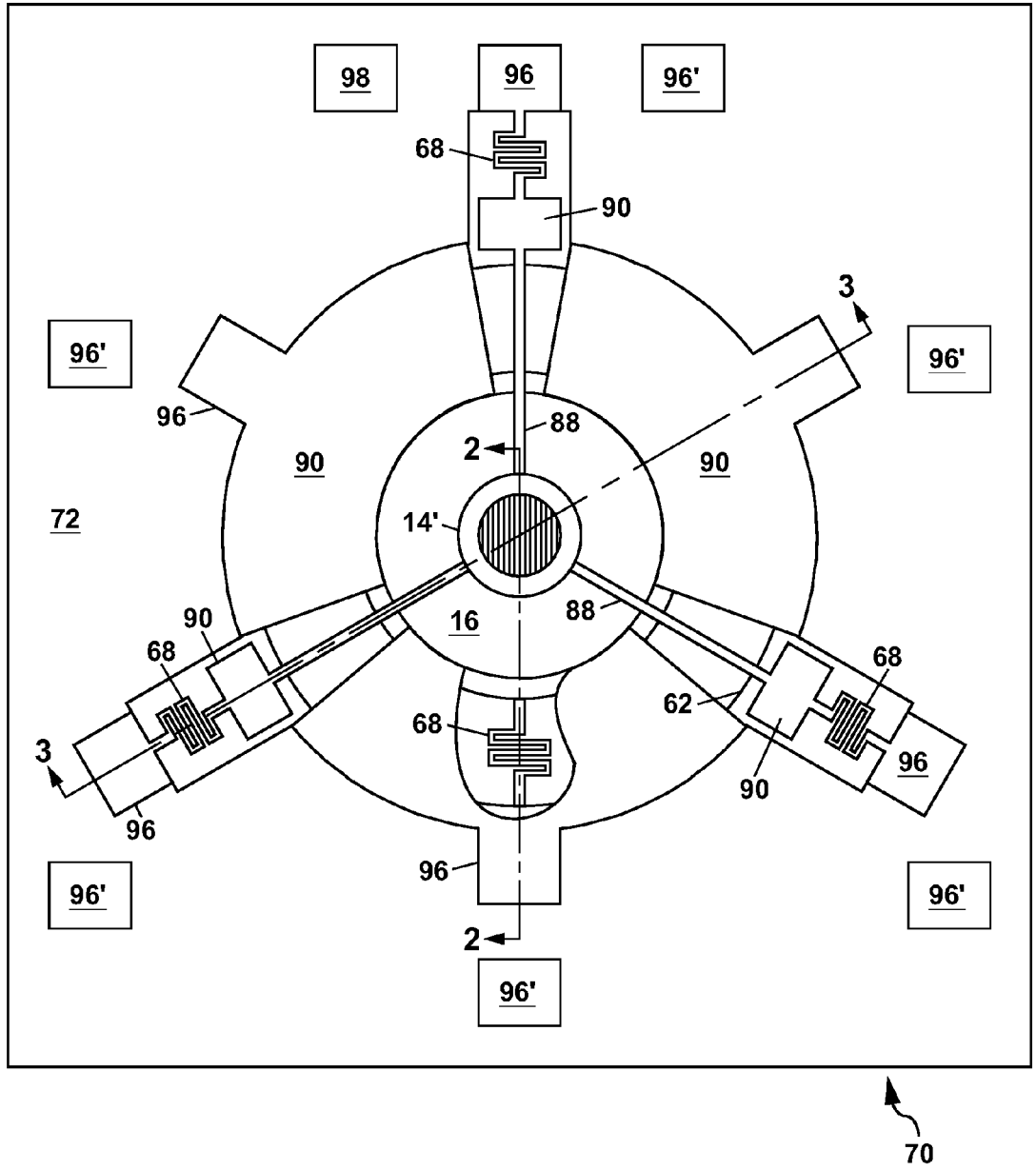
FIG. 8A shows a schematic plan view of a mirror/grating assembly which can be used in the apparatus of FIG. 7.
Figure 8B:
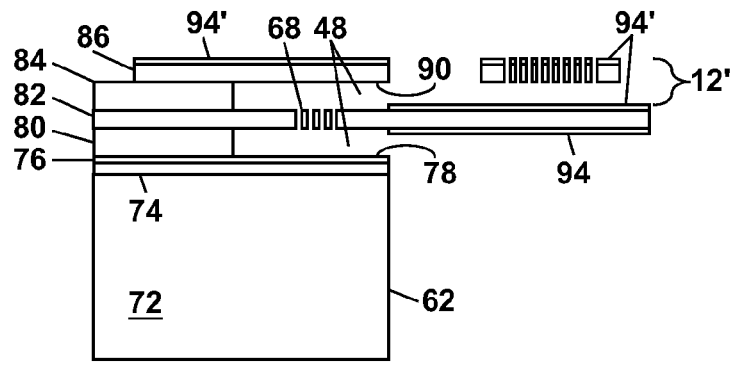
FIG. 8B shows a schematic cross-section view of the mirror/grating assembly of FIG. 8A along the section line 2-2 in FIG. 8A.
Figure 8C:
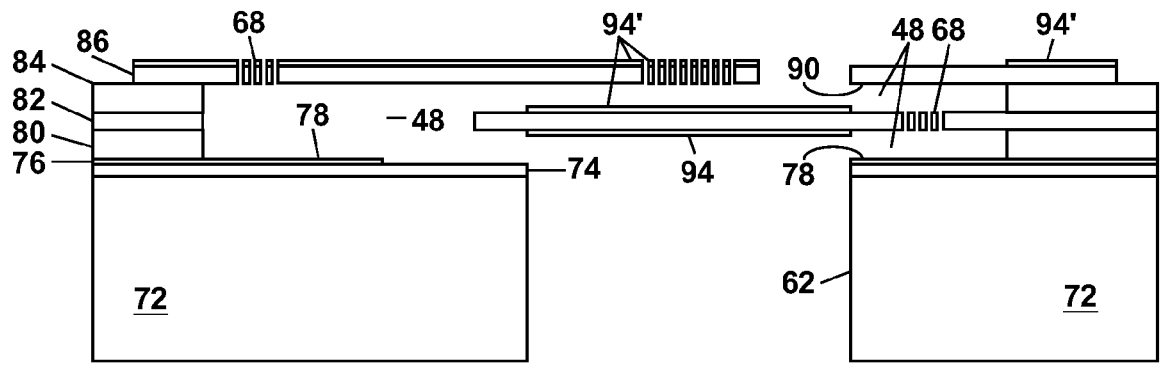
FIG. 8C shows a schematic cross-section view of the mirror/grating assembly of FIG. 8A along the section line 3-3 in FIG. 8A.

FIG. 8A shows a schematic plan view of a monolithic mirror/grating assembly 70 which can be formed by surface micromachining for use in the apparatus 10 of the present invention; and FIGS. 8B and 8C show schematic cross section views of this assembly 70 along the section lines 2-2 and 3-3, respectively, in FIG. 8A.

The mirror/grating assembly 70 comprises a substrate 72 which can comprise, for example, monocrystalline silicon, and which is equivalent to the spacer 58' in the example of FIG. 7. The mirror 16 and grating 14' can be built up on the substrate 72 by conventional surface micromachining which uses alternating material deposition and etching steps to build up the assembly 70 layer by layer. The various materials used for the assembly 70 can include layers of silicon nitride, TEOS (tetraethyl orthosilicate), and polysilicon which can be blanket deposited over the substrate 72 by chemical vapor deposition (CVD). A silicon nitride layer 74, which can be about 0.8 µm thick, can be used to form an electrically-insulating layer over the substrate 72. A thermal oxide layer (not shown) can also be formed from the silicon substrate 72 by thermally oxidizing the silicon to a depth of about 0.6 µm at an elevated temperature. This can provide additional electrical isolation for the assembly 70.

A first layer 76 of polysilicon, which can be about 0.3 µm thick, can be used to form a plurality of lower electrodes 78 on the substrate 72 for electrostatically moving the mirror 16, and also for electrostatically moving the grating 14'. The polysilicon layer 76 and the other polysilicon layers described hereinafter can be doped for electrical conductivity during CVD deposition using an impurity dopant such as boron or phosphorous.

A first sacrificial layer 80 of a sacrificial material such as TEOS or silicon dioxide can be deposited over the polysilicon layer 76 by CVD after the polysilicon layer 76 has been patterned to define the shape of the lower electrodes 78 by reactive ion etching with a photolithographically-defined etch mask (not shown). The first sacrificial layer 80, which can be, for example, 2 μm thick can then be planarized using a chemical-mechanical polishing (CMP) step. The use of CMP maintains a planar topography for each layer of the mirror/grating assembly 70.

A second polysilicon layer 82 can then be deposited and patterned to form the mirror 16 and the springs 68 which suspend the mirror 16 above the substrate 72. This polysilicon layer 82 can be, for example, about 2.25 μm thick. The mirror 16 can have a diameter up to a few millimeters (e.g. 0.2-2 mm).

A second sacrificial layer 84 can then be deposited by CVD and planarized by CMP. The second sacrificial layer 84 can be, for example, 2 μm thick.

A third polysilicon layer 86 can then be deposited by CVD and patterned by reactive ion etching to form the grating 14', to form a plurality of tethers 88 and springs 68 for suspending the grating 14' above the mirror 16, and also to form a plurality of upper electrodes 90 for electrostatically moving the grating 14' and the mirror 16 independently. The springs 68 can comprise folded springs, and can be, for example, 1 μm wide.

After building up the structure of the mirror/grating assembly 70, the openings 60 and 62 can be formed through the substrate 72 from a backside thereof, with the opening 60 being sized to admit the pump laser beam 24 and with the opening 62 being sized to hold the vapor cell 18. The openings 60 and 62 can be formed by deep reactive ion etching (also termed Bosch etching) as disclosed by Laermer in U.S. Pat. No. 5,501,893.

The mirror 16 and grating 14' can then be released for movement by removing the sacrificial layers 80 and 84 using a selective wet etchant comprising hydrofluoric acid (HF). The HF etchant etches away exposed portions of the sacrificial layers 80 and 84, but does not substantially chemically attack other materials including the silicon substrate 72, the polysilicon layers 76, 82 and 86 and the silicon nitride layer 74.

A metallization layer 94 comprising, for example, 10 nm of tungsten followed by 100 nm of gold can then be deposited on an underside of the mirror 16 by evaporation or sputtering. This can be done using the substrate 72 as a shadow mask. The metallization layer 94 forms a high-reflecting coating for the underside of the mirror 16 for the optical cavity 12.

Another metallization layer 94' with the same composition as the layer 94 can be deposited on a topside of the mirror 16 and also over the grating 14' to form high-reflecting coatings for the optical cavity 12'. A shadow mask can be used for depositing the metallization layer 94' so that the layer 94' is also deposited over the springs 68, tethers 88 and upper electrodes 90, and also to form a contact pad 96 for each upper electrode 90. To coat a central portion of the mirror 16 which lies beneath the grating 14', deposition of the metallization layer 94' can be optionally performed with the substrate 72 tilted at an angle and rotated. This can provide additional coverage of the central portion of the mirror 16 in addition to the coating which would otherwise be deposited through the openings between the grating lines in the grating 14'.

Electrical connections to the lower electrodes 78 can be made through wiring formed in the first polysilicon layer 76. This wiring can connect the lower electrodes 78 to one or more additional contact pads 96' formed by etching down to the first polysilicon layer 76. The contact pads 96' can then be formed using the metallization layer 94'. A ground electrical connection 98 can be similarly formed to the mirror 16 by etching down to the second polysilicon layer 82, and then depositing the metallization layer 94'.

In the mirror/grating assembly 70 of FIGS. 8A-8C, each lower electrode 78 can be operated in unison with a voltage applied between the contact pad 96' for that electrode 78 and the ground electrical connection 98 to form an electrostatic actuator 48 which moves the mirror 16 from its initial rest position down towards the grating 14. Similarly, a voltage can be applied to each upper electrode 90 overlying the mirror 16 to form additional electrostatic actuators 48 that operate can operate in unison to move the mirror 16 upward. In this way, the length L of the optical cavity 12 can be precisely adjusted for the magnetometer 10 of the present invention. A voltage can be similarly applied between the lower electrodes 78 and the upper electrodes 90 for the grating 14' to form electrostatic actuators 48 for moving the grating 14' towards the mirror 16 to adjust the length D of the optical cavity 12'. If needed, different voltages can be applied to the individual electrostatic actuators 48 for the mirror 16 or grating 14' to tilt these elements for alignment of the optical cavities 12 and 12'.

The voltage applied to the electrostatic actuators 48 for the mirror 16 and the grating 14' can be either a direct current (dc) voltage, or an alternating current (ac) voltage, or both. The use of a small ac voltage at a frequency of a few kiloHertz or more applied to the electrostatic actuators 48 for the grating 14' is useful to modulate the length of the optical cavity 12' so that synchronous detection with a lock-in amplifier can be used in the position sensing electronics for the magnetometer 10. Alternately, the electrostatic actuators 48 for the mirror 16 can be used to modulate the position of the mirror 16; and this will modulate the length of both optical cavities 12 and 12'. In some cases, the position of the grating 14' and mirror 16 can both be modulated at different frequencies.

Figure 9:
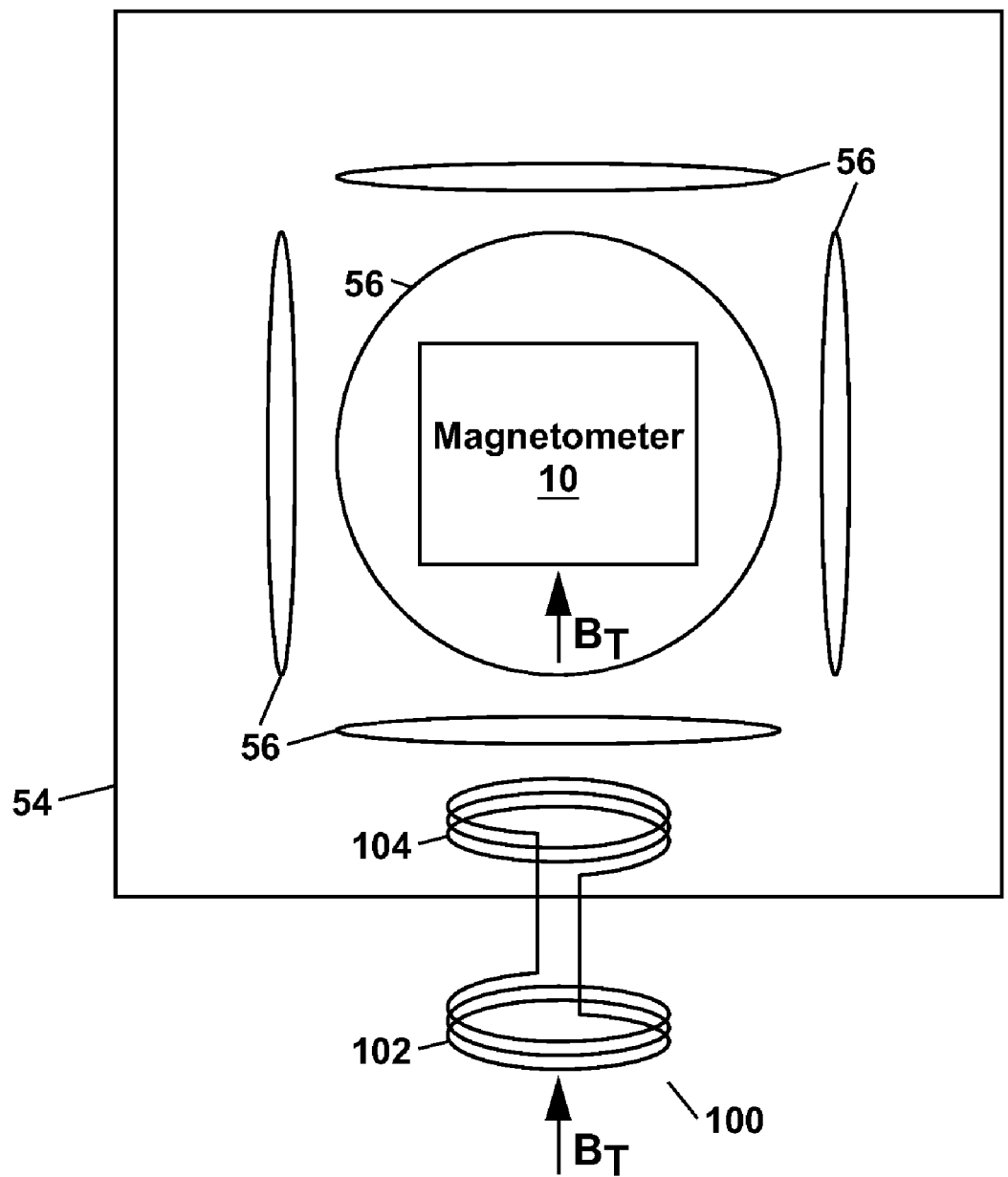
FIG. 9 schematically illustrates how a magnetic flux transformer can be used with the apparatus of the present invention to sense a transient magnetic field when the apparatus is located within a magnetic shield with a plurality of sets of magnetic-field-cancelling coils being used to cancel out a background magnetic field.

To detect a transient magnetic field $B_T$ (e.g. arising from the motion of a vehicle, or from the human brain, heart, or other organs, etc.,) which changes over time, the magnetometer 10 of the present invention can be located within a magnetic shield 54 as shown in FIG. 5 with a set of two magnetic-field-cancelling coils 56 being located about the apparatus 10 in each of three orthogonal directions (i.e. x, y, and z directions) to substantially cancel out the background level of the magnetic field (e.g. due to the earth's magnetic field) in each direction. A magnetic flux transformer 100 having one coil 102 located outside the magnetic shield 54 and another coil 104 located inside the magnetic shield 54 can then be used to couple the transient magnetic field $B_T$ inside the magnetic shield 54 so that it can be sensed with the apparatus 10, while blocking other magnetic fields which are substantially constant over a time scale larger than that which can be coupled through the magnetic flux transformer 100. The magnetic flux transformer 100 can be designed, for example, to couple transient magnetic fields $B_T$ which are changing on a time scale on the order of one second or less, with the exact time scale depending upon the size of the coils 102 and 104 in the magnetic flux transformer 100 and on the strength of the transient magnetic field $B_T$. FIG. 9 schematically illustrates the use of the magnetic flux transformer 100 with a magnetometer 10 formed according to the present invention.

The use of the magnetic flux transformer 100 with the apparatus 10 also allows the coils 102 and 104 to be oriented in different directions with respect to each other. This is useful since the coil 104 can be oriented in a particular direction which is optimal for the apparatus 10 while the other coil 102 can be moved as needed to sense transient magnetic fields $B_T$ in different directions. The size and number of turns in each coil 102 and 104 can also be different; and this is useful, for example, to amplify a very weak transient magnetic field $B_T$, or to attenuate a very strong transient magnetic field $B_T$.

Figure 10:
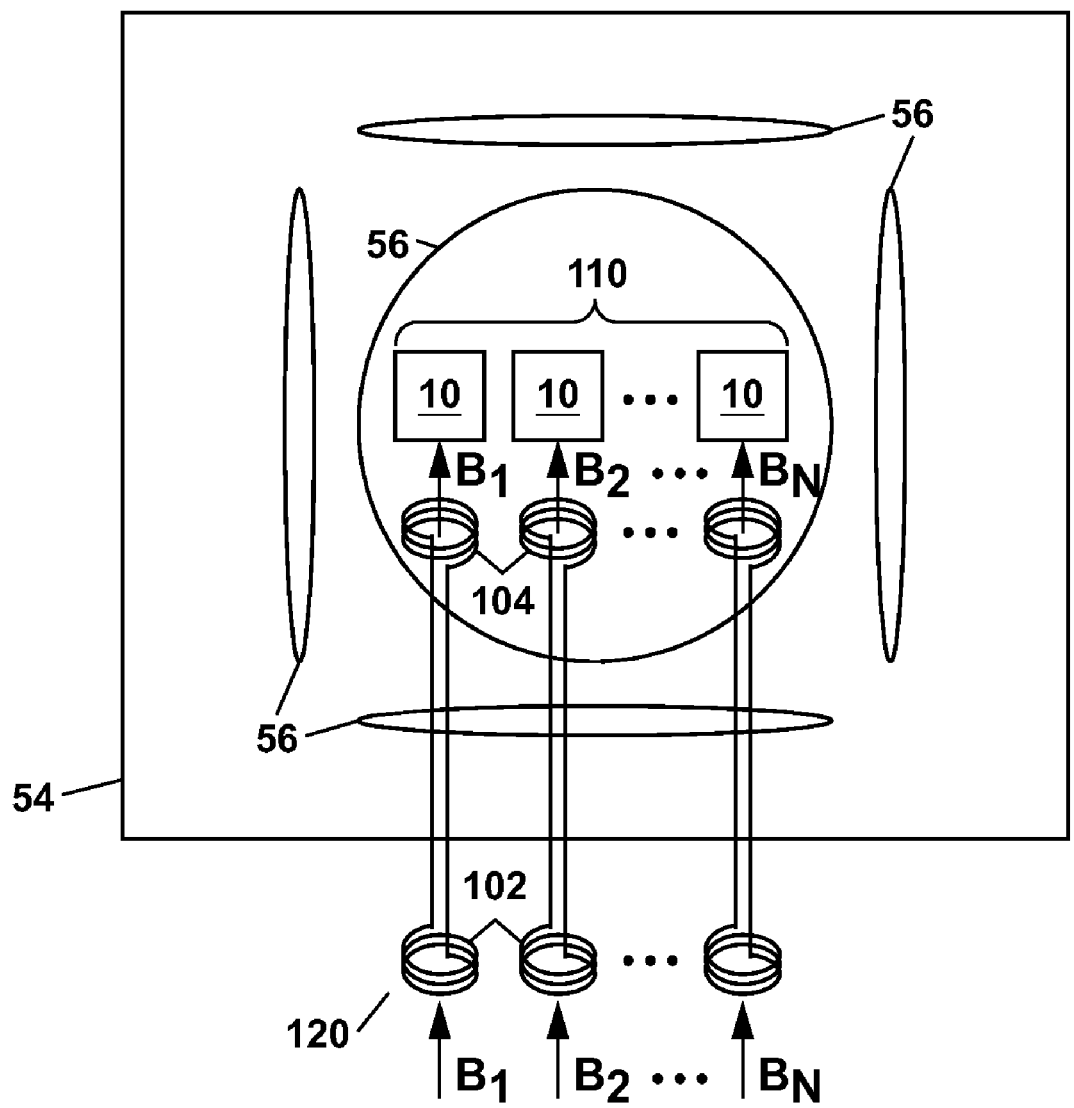
FIG. 10 schematically illustrates a magnetometer array formed according to the present invention.

A plurality of N magnetometers 10 formed according to the present invention can be used to form a one-dimensional (1D) or two-dimensional (2D) magnetometer array 110 for use in magnetic imaging measurements. When such a magnetometer array 110 is located within a magnetic shield 54 with magnetic-field-cancelling coils 56, a 1D or 2D array of magnetic flux transformers 120 can be used to couple a spatially-varying transient magnetic field $B_T$ with components $B_1$, $B_2$ ... $B_N$ to the magnetometer array 110. This is schematically illustrated in FIG. 10. The magnetometer array 110 can be used for many different applications including non-destructive testing and imaging of biomagnetic fields associated with heart and brain activity.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. An apparatus for sensing a magnetic field, comprising:
    an optical cavity formed by a grating and a mirror spaced about a vapor cell which contains an alkali metal vapor;
    a pump laser beam directed into the vapor cell to magnetically polarize the alkali metal vapor;
    a probe laser beam directed into the optical cavity and through the vapor cell to generate a diffracted laser beam from the optical cavity, with the diffracted laser beam having a zeroth-order component and a first-order component, and with each component of the diffracted laser beam having an intensity which depends upon the magnetic field;
    a photodetector to detect each component of the diffracted beam and to generate therefrom an electrical output signal wherefrom an intensity of the magnetic field can be determined.

2. The apparatus of claim 1 wherein the mirror comprises a moveable mirror.

3. The apparatus of claim 2 wherein the moveable mirror is suspended by a plurality of springs and is moveable by at least one actuator which is electrostatically coupled to the moveable mirror.

4. The apparatus of claim 1 wherein the vapor cell further contains a buffer gas which comprises a noble gas.

5. The apparatus of claim 4 wherein the buffer gas further comprises nitrogen.

6. The apparatus of claim 1 wherein the pump laser beam is circularly polarized.

7. The apparatus of claim 1 further comprising a magnetic shield and at least one set of magnetic-field-cancelling coils provided about the optical cavity to substantially cancel a background magnetic field.

8. The apparatus of claim 1 wherein the alkali metal vapor is heated to a temperature which is effective to provide a density of the alkali metal vapor which is greater than $10^{11}$ atoms-cm$^{-3}$.

9. An apparatus for sensing a magnetic field, comprising:
    a vapor cell containing an alkali metal vapor;
    an optical cavity formed about the vapor cell, with the optical cavity being formed from a transmission grating and a mirror;
    a pump laser beam directed into the vapor cell to magnetically polarize the alkali metal vapor;
    a probe laser beam directed into the optical cavity and through the vapor cell containing the alkali metal vapor to generate a diffraction pattern which depends upon the magnetic field, with the diffraction pattern being transmitted out of the optical cavity; and
    a plurality of photodetectors to detect the diffraction pattern and thereby generate electrical output signals wherefrom the magnetic field can be determined.

10. The apparatus of claim 9 wherein the alkali metal vapor consists of an alkali metal selected from the group of alkali metals consisting of sodium, potassium, rubidium and cesium.

11. The apparatus of claim 10 wherein the vapor cell further contains a buffer gas which comprises a noble gas.

12. The apparatus of claim 11 wherein the buffer gas further comprises nitrogen.

13. The apparatus of claim 9 wherein the transmission grating is a first-order transmission grating.

14. The apparatus of claim 9 wherein the mirror comprises a moveable mirror.

15. The apparatus of claim 14 wherein the moveable mirror is suspended by a plurality of springs, with at least one electrostatic actuator being coupled to the mirror for movement thereof.

16. The apparatus of claim 14 further comprising another optical cavity formed from the moveable mirror and another transmission grating, with a position-sensing laser beam being directed into the other optical cavity to determine a position of the moveable mirror.

17. The apparatus of claim 9 wherein the probe laser beam is generated by a vertical-cavity surface-emitting laser.

18. An apparatus for sensing a magnetic field, comprising:
    a vapor cell containing an alkali metal vapor;
    an optical cavity formed about the vapor cell, with the optical cavity comprising a transmission grating and a mirror;
    a pump laser beam directed into the vapor cell to magnetically polarize the alkali metal vapor;
    a probe laser beam directed into the optical cavity, with the probe laser beam passing through the vapor cell and being reflected by the mirror and diffracted by the transmission grating to form at least one diffracted laser beam having an intensity which depends on an interaction of the magnetic field with the magnetically-polarized alkali metal vapor; and
    a photodetector to detect each diffracted laser beam and to generate therefrom an electrical output signal to provide an indication of the magnetic field.

19. The apparatus of claim 18 wherein the pump laser beam is circularly polarized.

20. The apparatus of claim 18 wherein the each laser beam is generated by a vertical-cavity surface-emitting laser.

21. The apparatus of claim 18 wherein the at least one diffracted laser beam comprises a zeroth-order diffracted laser beam and a first-order diffracted laser beam.

22. The apparatus of claim 18 wherein the mirror is moveable by at least one electrostatic actuator.

23. The apparatus of claim 18 further comprising another optical cavity formed by the mirror and another transmission grating, with a position-sensing laser beam being directed into this other optical cavity to determine a position of the mirror.

24. The apparatus of claim 18 wherein the probe laser beam is directed into the optical cavity along an optical axis thereof, and the pump laser beam is directed into the vapor cell at an angle which is substantially perpendicular to the optical axis of the optical cavity.

* * * * *